(12) United States Patent
Toriumi et al.

(10) Patent No.: US 7,768,316 B2
(45) Date of Patent: Aug. 3, 2010

(54) DECODER CIRCUIT, DECODING METHOD, OUTPUT CIRCUIT, ELECTRO-OPTICAL DEVICE, AND ELECTRONIC INSTRUMENT

(75) Inventors: Yuichi Toriumi, Fujimi-machi (JP); Motoaki Nishimura, Fujimi-machi (JP); Takeshi Nomura, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/389,938

(22) Filed: Feb. 20, 2009

(65) Prior Publication Data

US 2009/0212820 A1 Aug. 27, 2009

(30) Foreign Application Priority Data

Feb. 22, 2008 (JP) ............................. 2008-041406

(51) Int. Cl.
*G11C 8/00* (2006.01)
(52) U.S. Cl. ................................. 326/105; 365/230.06
(58) Field of Classification Search .................. 326/105; 365/230.06
See application file for complete search history.

(56) References Cited

U.S. PATENT DOCUMENTS

| | | | |
|---|---|---|---|
| 5,388,072 A * | 2/1995 | Matick et al. ........... | 365/230.03 |
| 5,497,353 A * | 3/1996 | Sato et al. .............. | 365/230.05 |
| 5,602,778 A * | 2/1997 | Futatsuya et al. ....... | 365/185.09 |
| 5,621,690 A * | 4/1997 | Jungroth et al. ......... | 365/200 |
| 5,740,121 A | 4/1998 | Suzuki et al. | |
| 5,898,627 A * | 4/1999 | Yoshikawa ............... | 365/200 |
| 6,198,686 B1 * | 3/2001 | Takita et al. ............ | 365/230.06 |
| 6,496,442 B2 * | 12/2002 | Koyanagi et al. ....... | 365/230.03 |
| 6,992,948 B2 * | 1/2006 | Asada ..................... | 365/230.06 |

FOREIGN PATENT DOCUMENTS

| | | |
|---|---|---|
| JP | A-7-169276 | 7/1995 |
| JP | A-2002-279792 | 9/2002 |
| JP | A-2005-70673 | 3/2005 |
| JP | A-2007-43035 | 2/2007 |

* cited by examiner

*Primary Examiner*—James H. Cho
*Assistant Examiner*—Jason Crawford
(74) *Attorney, Agent, or Firm*—Oliff & Berridge, PLC

(57) ABSTRACT

A decoder circuit comprises: first decoder section that decodes an m-bit address signal portion of an (m+n)-bit address signal; and a second decoder section that decodes an n-bit address signal portion of the (m+n)-bit address signal, the first decoder section including a first AND operation circuit section that outputs signals that indicate a decoding result of the m-bit address signal portion, and a second AND operation circuit section that outputs signals that indicate a decoding result of part of the m-bit address signal portion, and the second decoder section including a third AND operation circuit section that outputs signals that indicate a decoding result of the n-bit address signal portion, and a fourth AND operation circuit section that outputs signals that indicate a decoding result of part of the n-bit address signal portion.

12 Claims, 15 Drawing Sheets

DECODER CIRCUIT, DECODING METHOD, OUTPUT CIRCUIT, ELECTRO-OPTICAL DEVICE, AND ELECTRONIC INSTRUMENT

Japanese Patent Application No. 2008-41406 filed on Feb. 22, 2008, is hereby incorporated by reference in its entirety.

BACKGROUND

The present invention relates to a decoder circuit, a decoding method, an output circuit, an electro-optical device, an electronic instrument, and the like.

An electronic instrument (e.g., electro-optical device) or a circuit (e.g., scan driver (gate driver)) included in an electronic instrument may include a decoder circuit (see JP-A-2007-043035 (FIG. 8C) and JP-A-2005-070673 (FIGS. 1 and 8), for example).

In FIG. 8C of JP-A-2007-043035, a level shifter section 76 of a scan driver 70 has level shifters in a number equal to the number of scan lines. An address decoder 74 of the scan driver 70 disclosed in JP-A-2007-043035 may be divided into two sections (e.g., decoders DCR-A and DCR-B disclosed in FIG. 1 of JP-A-2005-070673) in order to reduce the number of level shifters. However, since an incorrect scan voltage (glitch or noise) occurs in a scan line when a scan address signal generated by a scan address generation circuit 73 changes (i.e., when another scan line is selected), the scan driver 70 disclosed in JP-A-2007-043035 must be provided with a latch circuit such as a latch circuit LT shown in FIG. 1 of JP-A-2005-070673.

SUMMARY

According to one aspect of the invention, there is provided a decoder circuit that decodes an (m+n)-bit address signal that includes an m-bit address signal portion and an n-bit address signal portion, the decoder circuit comprising:

a first decoder section that decodes the m-bit address signal portion; and a second decoder section that decodes the n-bit address signal portion, the first decoder section including a first AND operation circuit section that outputs signals that indicate a decoding result of the m-bit address signal portion, and a second AND operation circuit section that outputs signals that indicate a decoding result of part of the m-bit address signal portion;

the second decoder section including a third AND operation circuit section that outputs signals that indicate a decoding result of the n-bit address signal portion, and a fourth AND operation circuit section that outputs signals that indicate a decoding result of part of the n-bit address signal portion;

an output enable signal that has a pulse width shorter than a logical time length of the (m+n)-bit address signal being input to the second AND operation circuit section; and the output enable signal being input to the fourth AND operation circuit section.

According to another aspect of the invention, there is provided an output circuit comprising:

a decoder circuit that decodes an (m+n)-bit address signal; and

M (M is an integer) AND operation circuits, the decoder circuit including:

a first decoder section that decodes an m-bit address signal portion of the (m+n)-bit address signal; and a second decoder section that decodes an n-bit address signal portion of the (m+n)-bit address signal;

the first decoder section including a first AND operation circuit section that outputs signals that indicate a decoding result of the m-bit address signal portion, and a second AND operation circuit section that outputs signals that indicate a decoding result of part of the m-bit address signal portion; and the signals from the first decoder section and the signals from the second decoder section being input to each of the M AND circuits.

According to another aspect of the invention, there is provided an electro-optical device comprising the above decoder circuit.

According to another aspect of the invention, there is provided an electro-optical device comprising the above output circuit.

According to another aspect of the invention, there is provided an electronic instrument comprising the above decoder circuit.

According to another aspect of the invention, there is provided an electronic instrument comprising the above output circuit.

According to another aspect of the invention, there is provided a decoding method comprising:

preparing an (m+n)-bit address signal;

preparing an output enable signal that has a pulse width shorter than a logical time length of the (m+n)-bit address signal;

decoding part of a lower-order n-bit address signal portion of the (m+n)-bit address signal to generate a first decoding result;

decoding the remainder of the lower-order n-bit address signal portion and the output enable signal to generate a second decoding result;

decoding the first decoding result and the second decoding result to generate a third decoding result;

decoding a higher-order m-bit address signal portion of the (m+n)-bit address signal to generate a fourth decoding result; and decoding the third decoding result and the fourth decoding result to generate a fifth decoding result.

DESCRIPTION OF EXEMPLARY EMBODIMENTS

Figure 1:
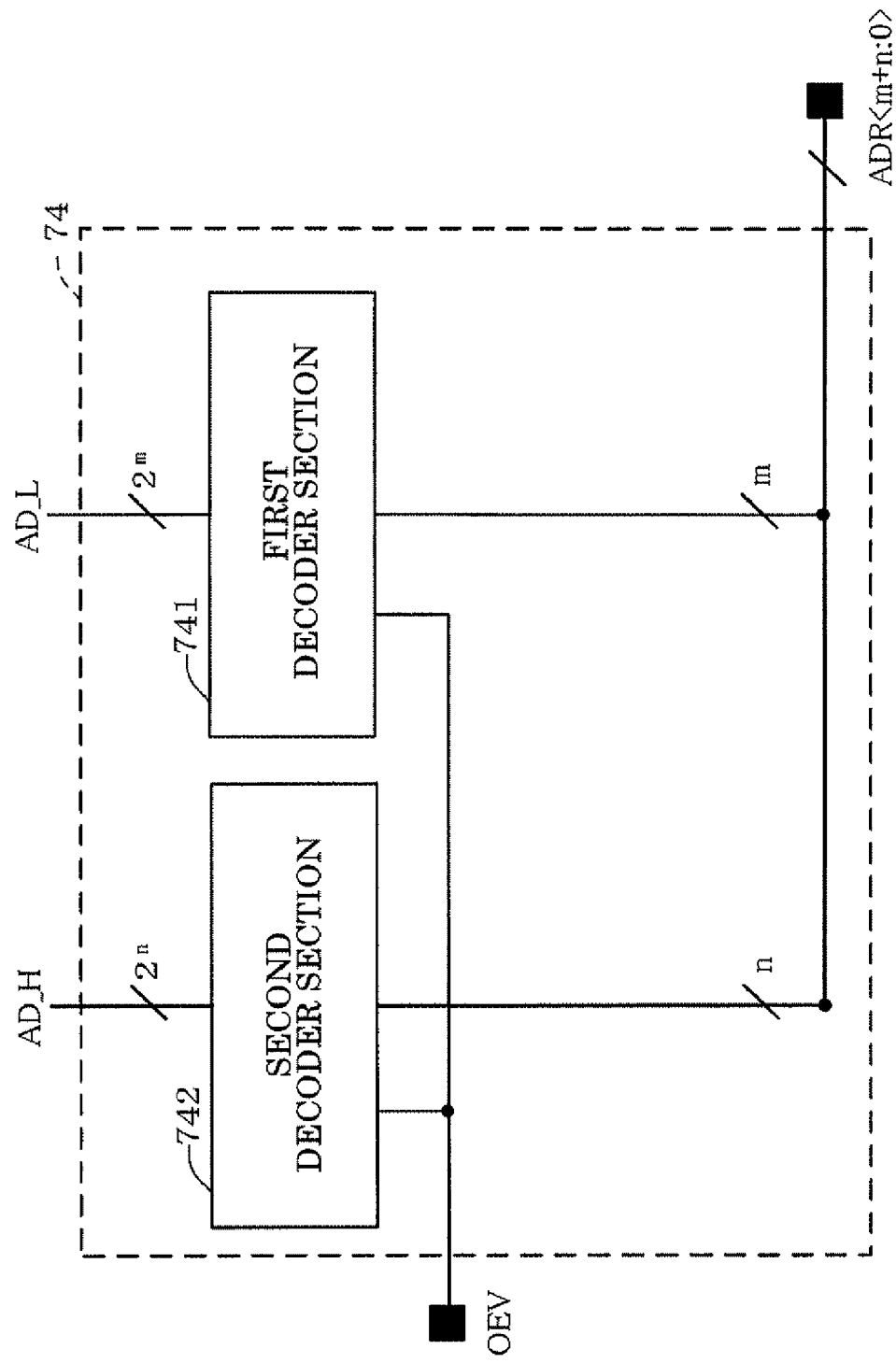
FIG. 1 shows a configuration example of a decoder circuit.

Several aspects of the invention may provide a small decoder circuit, a decoding method, an output circuit, an electro-optical device, and an electronic instrument.

Aspects according to the invention are given below. The following aspects are given so that the invention can be readily understood. Accordingly, the following aspects do not in any way limit the scope of the invention.

According to one embodiment of the invention, there is provided a decoder circuit that decodes an (m+n)-bit address signal that includes an m-bit address signal portion and an n-bit address signal portion, the decoder circuit comprising:

a first decoder section that decodes the m-bit address signal portion; and a second decoder section that decodes the n-bit address signal portion, the first decoder section including a first AND operation circuit section that outputs signals that indicate a decoding result of the m-bit address signal portion, and a second AND operation circuit section that outputs signals that indicate a decoding result of part of the m-bit address signal portion;

the second decoder section including a third AND operation circuit section that outputs signals that indicate a decoding result of the n-bit address signal portion, and a fourth AND operation circuit section that outputs signals that indicate a decoding result of part of the n-bit address signal portion;

an output enable signal that has a pulse width shorter than a logical time length of the (m+n)-bit address signal being input to the second AND operation circuit section; and the output enable signal being input to the fourth AND operation circuit section.

The output enable signal is input to the second AND operation circuit section that outputs signals that indicate the decoding result of part of the m-bit address signal portion and the fourth AND operation circuit section that outputs signals that indicate the decoding result of part of the n-bit address signal portion. Since the decoder circuit includes the second AND operation circuit section and the fourth AND operation circuit section, the decoder circuit need not include a latch circuit such as the latch circuit LT shown in FIG. 1 of JP-A-2005-070673. The second AND operation circuit section and the fourth AND operation circuit section can be formed by a simple configuration as compared with the configuration of a latch circuit. Therefore, this embodiment can provide a small decoder circuit.

In the decoder circuit, the second AND operation circuit section may include at least one first AND operation circuit, the output enable signal may be input to the at least one first AND operation circuit; and the fourth AND operation circuit section may include at least one second AND operation circuit, the output enable signal may be input to the at least one second AND operation circuit.

In the decoder circuit, the second AND operation circuit section may include a plurality of first AND operation circuits, the output enable signal may be input to each of the plurality of first AND operation circuits; and the fourth AND operation circuit section may include a plurality of second AND operation circuits, the output enable signal may be input to each of the plurality of second AND operation circuits.

In the decoder circuit, the first decoder section may further include a first logic circuit section that outputs signals that indicate a decoding result of the remainder of the m-bit address signal portion, the output enable signal being not input to the first logic circuit section; and the second decoder section may further include a second logic circuit section that outputs signals that indicate a decoding result of the remainder of the n-bit address signal portion, the output enable signal being not input to the second logic circuit section.

According to another embodiment of the invention, there is provided an output circuit comprising:

a decoder circuit that decodes an (m+n)-bit address signal; and

M AND operation circuits, the decoder circuit including:

a first decoder section that decodes an m-bit address signal portion of the (m+n)-bit address signal; and a second decoder section that decodes an n-bit address signal portion of the (m+n)-bit address signal;

the first decoder section including a first AND operation circuit section that outputs signals that indicate a decoding result of the m-bit address signal portion, and a second AND operation circuit section that outputs signals that indicate a decoding result of part of the m-bit address signal portion; and the signals from the first decoder section and the signals from the second decoder section being input to each of the M AND operation circuits.

The output circuit can be formed by a simple configuration. Therefore, this embodiment can provide a small output circuit.

The output circuit may further comprise:

a first level shifter section that shifts levels of the signals from the first decoder section; and a second level shifter section that shifts levels of the signals from the second decoder section, the signals from the first decoder section being input to each of the M AND operation circuits through the first level shifter section, the signals from the second decoder section being input to each of the M AND operation circuits through the second level shifter section.

In the output circuit, $2^{m-1} < M^{0.5} \leq 2^m$ may be satisfied when $2^{m+n-1} < M \leq 2^{m+n}$.

The (m+n)-bit address signal is divided into the m-bit address signal portion and the n-bit address signal portion within such a range. According to this embodiment, the size of the first level shifter section and the second level shifter section can be minimized.

According to another embodiment of the invention, there is provided an electro-optical device comprising one of the above decoder circuits. According to another embodiment of the invention, there is provided an electro-optical device comprising one of the above output circuits. According to another embodiment of the invention, there is provided an electronic instrument comprising one of the above decoder circuits. According to another embodiment of the invention, there is provided an electronic instrument comprising one of the above output circuits.

According to another embodiment of the invention, there is provided a decoding method comprising:

preparing an (m+n)-bit address signal;

preparing an output enable signal that has a pulse width shorter than a logical time length of the (m+n)-bit address signal;

decoding part of a lower-order n-bit address signal portion of the (m+n)-bit address signal to generate a first decoding result;

decoding the remainder of the lower-order n-bit address signal portion and the output enable signal to generate a second decoding result;

decoding the first decoding result and the second decoding result to generate a third decoding result;

decoding a higher-order m-bit address signal portion of the (m+n)-bit address signal to generate a fourth decoding result; and decoding the third decoding result and the fourth decoding result to generate a fifth decoding result.

A person skilled in the art would readily appreciate that the above-described embodiments according to the invention may be modified without materially departing from the spirit and the scope of the invention. For example, at least one element of one embodiment according to the invention may be added to another embodiment according to the invention. Alternatively, at least one element of one embodiment according to the invention may be replaced by at least one element of another embodiment according to the invention.

Preferred embodiments of the invention are described in detail below with reference to the drawings. Note that the following embodiments do not in any way limit the scope of the invention laid out in the claims. Note also that all elements described below should not be necessarily taken as essential requirements for the invention.

1. Decoder Circuit

FIG. 1 shows a configuration example of a decoder circuit. As shown in FIG. 1, a decoder circuit 74 decodes an (m+n)-bit address signal ADR. The address signal ADR may be divided into an m-bit address signal portion and an n-bit address signal portion. The decoder circuit 74 includes a first decoder section 741 that decodes the m-bit address signal portion, and a second decoder section 742 that decodes the n-bit address signal portion. An output enable signal OEV that has a pulse width shorter than the logical time length of the address signal ADR is input to the first decoder section 741 and the second decoder section 741.

Figure 2:
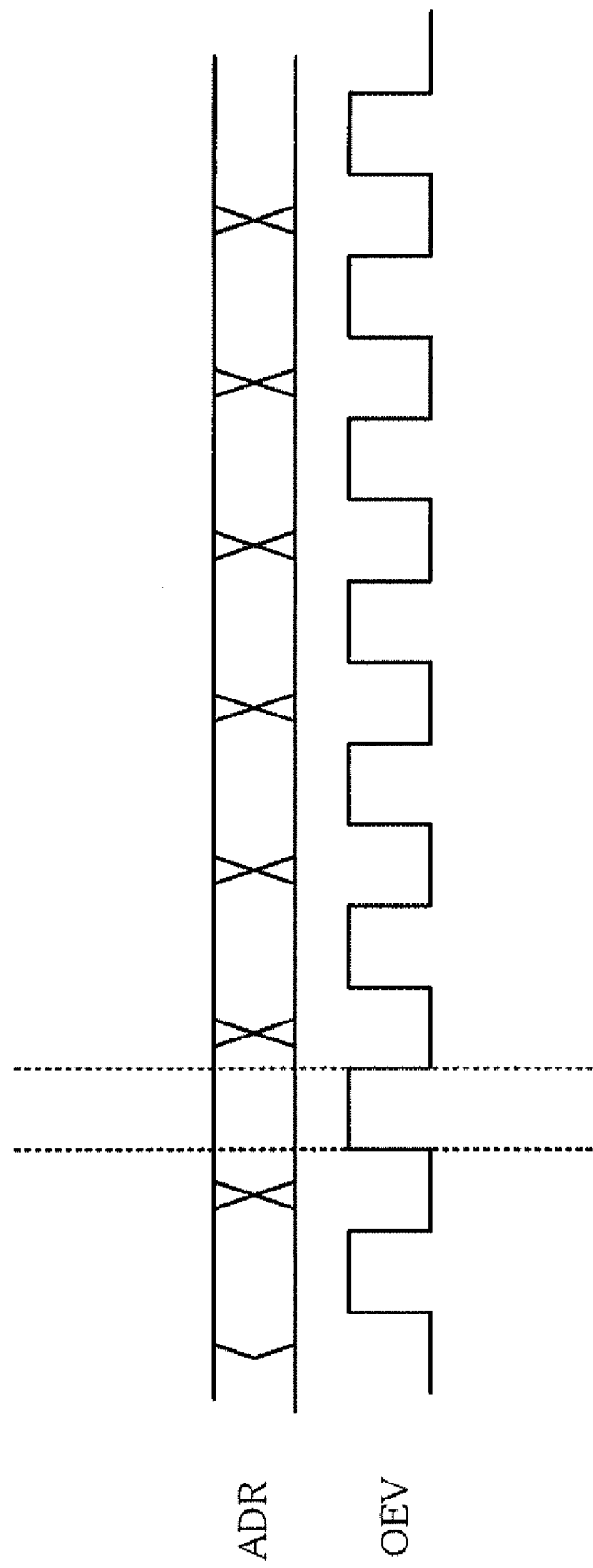
FIG. 2 is a view illustrative of an output enable signal OEV.

FIG. 2 is a view illustrative of the output enable signal OEV. As shown in FIG. 2, a pulse of the output enable signal OEV has a pulse width shorter than the logical time length (unit period that indicates the HIGH level or the LOW level) of the address signal ADR.

Figure 3:
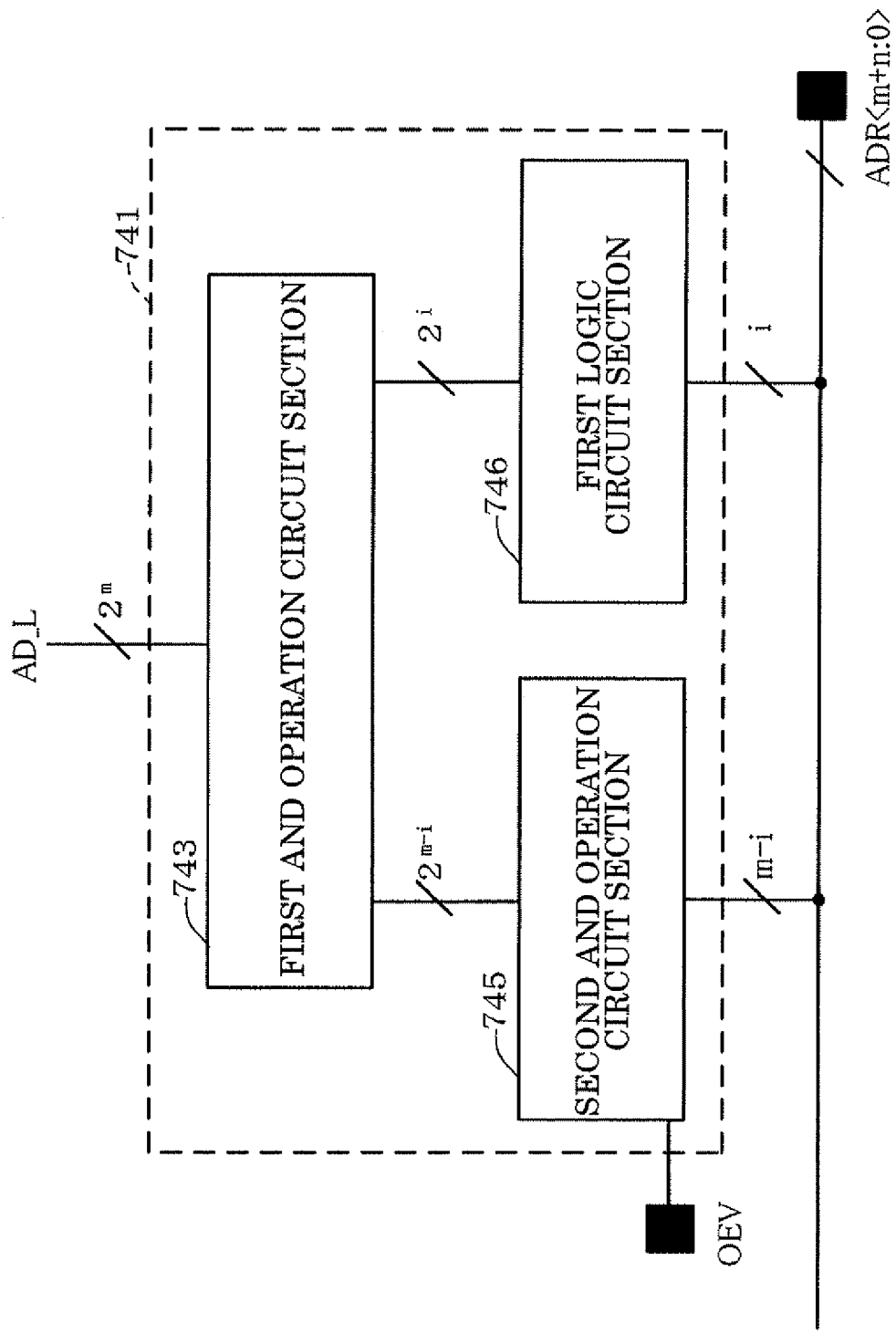
FIG. 3 shows a configuration example of a first decoder section 741 shown in FIG. 1.
Figure 4:
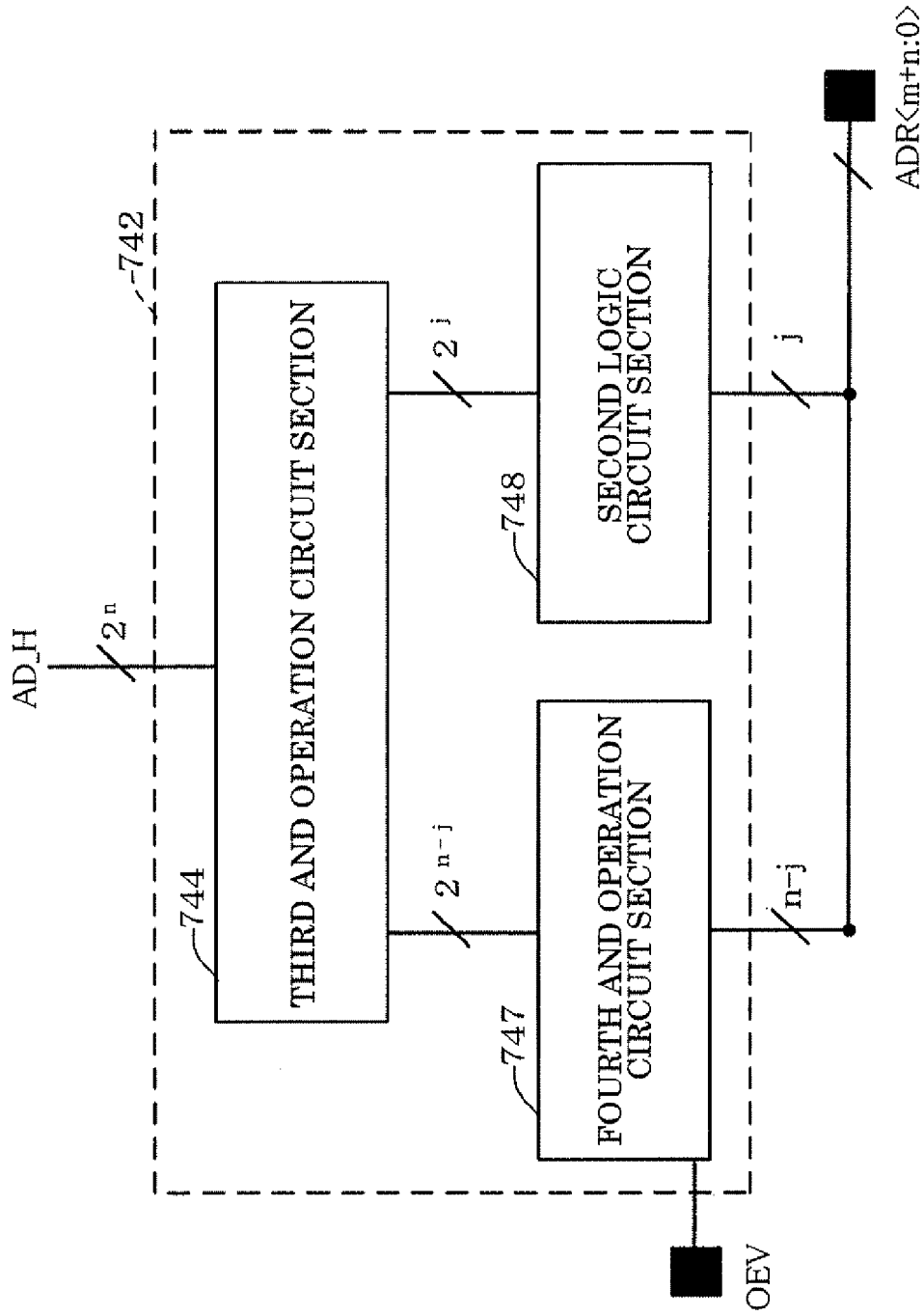
FIG. 4 shows a configuration example of a second decoder section 742 shown in FIG. 1.

FIGS. 3 and 4 show configuration examples of the first decoder section 741 and the second decoder section 742 shown in FIG. 1.

As shown in FIG. 3, the first decoder section 741 includes a first AND operation circuit section 743 that outputs signals that indicate the decoding result of the m-bit address signal portion, and a second AND operation circuit section 745 that outputs signals that indicate the decoding result of part of the m-bit address signal portion. The first decoder section 741 further includes a first logic circuit section 746 that outputs signals that indicate the decoding result of the remainder of the m-bit address signal portion. The output enable signal OEV that has a pulse width shorter than the logical time length of the address signal ADR is input to the second AND operation circuit section 745. The output enable signal OEV is not input to the first logic circuit section 746.

As shown in FIG. 4, the second decoder section 742 has a configuration similar to that of the first decoder section 741. The second decoder section 742 includes a third AND operation circuit section 744 that outputs signals that indicate the decoding result of the n-bit address signal portion, and a fourth AND operation circuit section 747 that outputs signals that indicate the decoding result of part of the n-bit address signal portion. The second decoder section 742 further includes a second logic circuit section 748 that outputs signals that indicate the decoding result of the remainder of the n-bit address signal portion. The output enable signal OEV is not input to the fourth AND operation circuit section 747. The output enable signal OEV is not input to the second logic circuit section 748.

Figure 5:
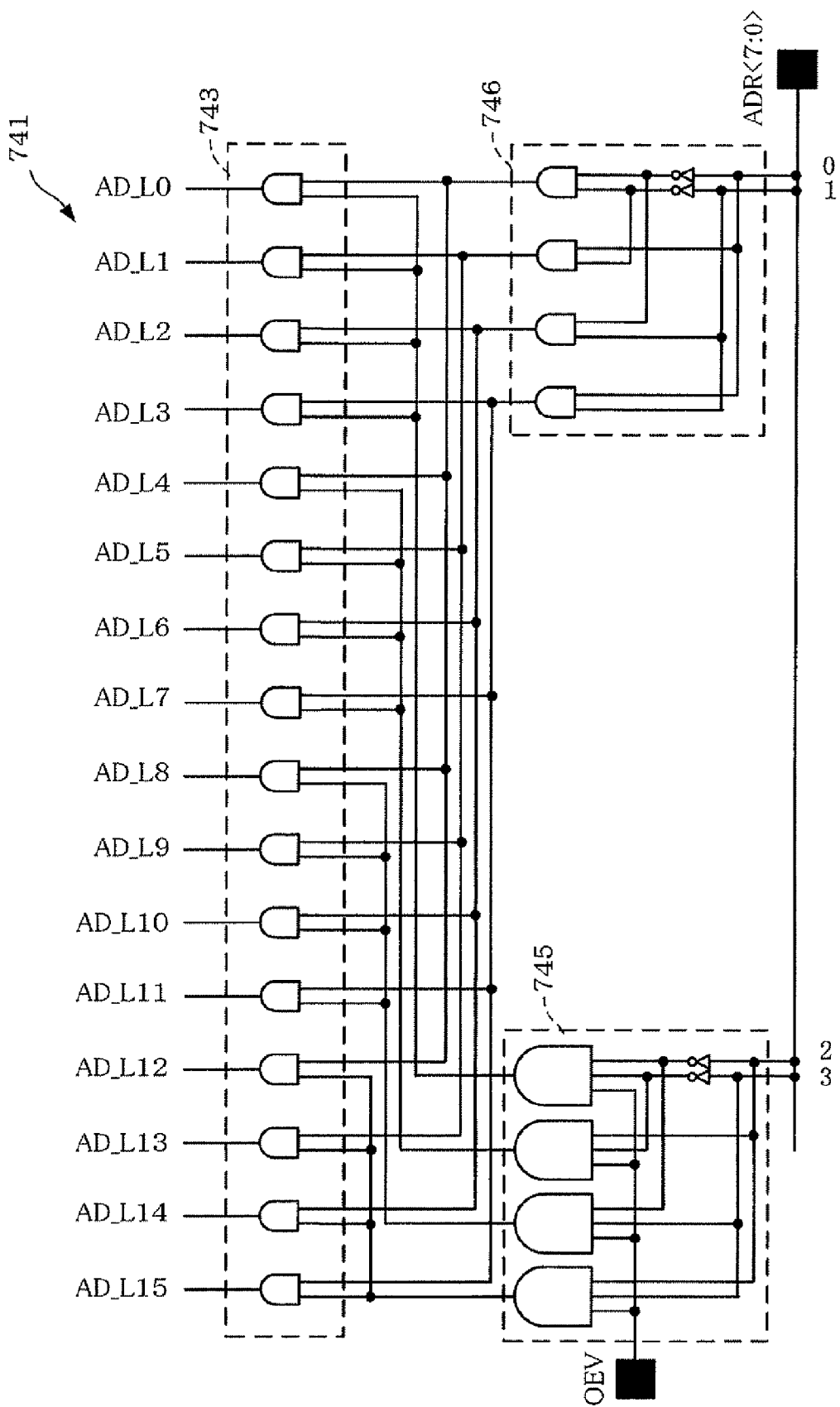
FIG. 5 shows a specific configuration example of the first decoder section 741 shown in FIG. 1.
Figure 6:
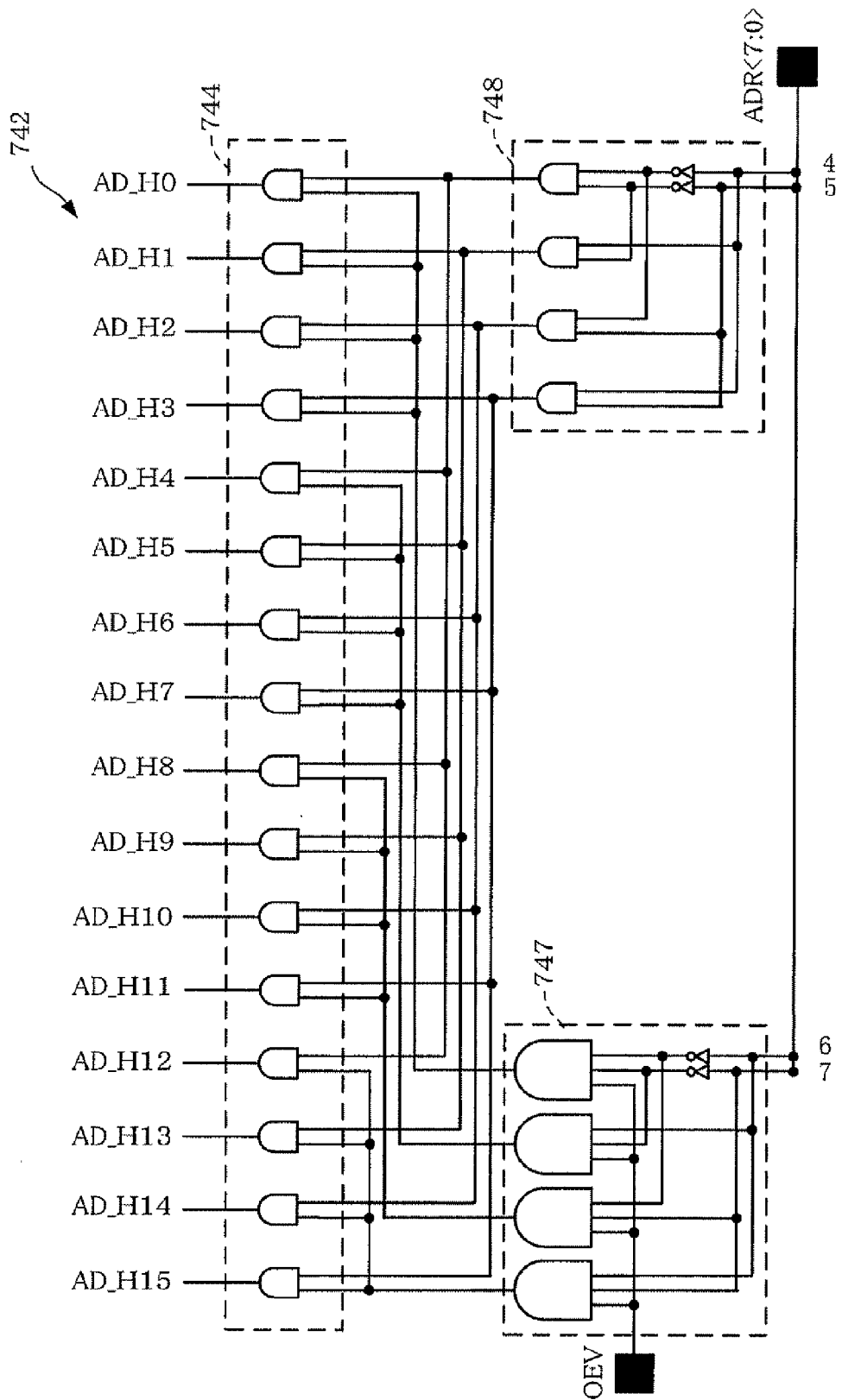
FIG. 6 shows a specific configuration example of the second decoder section 742 shown in FIG. 1.

FIGS. 5 and 6 show specific configuration examples of the first decoder section 741 and the second decoder section 742 shown in FIG. 1. In the examples shown in FIGS. 5 and 6, an 8-bit address signal ADR includes a lower-order 4-bit address signal portion and a higher-order 4-bit address signal portion. The first decoder section 741 decodes the lower-order 4-bit address signal portion. The second decoder section 742 decodes the higher-order 4-bit address signal portion.

As shown in FIG. 5, the first decoder section 741 includes the first AND operation circuit section 743 that outputs signals AD_L0 to AD_L15 that indicate the decoding result of the lower-order 4-bit address signal portion. The first AND operation circuit section 743 includes $2^4$ AND operation circuits (e,g., AND circuits). The first decoder section 741 further includes the second AND operation circuit section 745 that outputs signals that indicate the decoding result of part (2 bits) of the lower-order 4-bit address signal portion. The second AND operation circuit section 745 includes $2^2$ AND operation circuits (e.g., AND circuits). The first decoder section 741 further includes the first logic circuit section 746 that outputs signals that indicate the decoding result of the remainder (2 bits) of the lower-order 4-bit address signal portion. The first logic circuit section 746 includes $2^2$ AND operation circuits (e.g., AND circuits).

Each of the $2^2$ AND operation circuits of the first logic circuit section 746 is a two-input, one-output AND circuit. Each of the $2^2$ AND operation circuits of the first logic circuit section 746 includes a first input section that receives a first 1-bit address signal portion (inverted or non-inverted) of the remainder (2 bits) of the lower-order 4-bit address signal portion, and a second input section that receives a second 1-bit address signal portion (inverted or non-inverted) of the remainder (2 bits) of the lower-order 4-bit address signal portion. Each of the $2^2$ AND operation circuits of the first logic circuit section 746 performs an AND operation on the signals input to the first and second input sections. The first logic circuit section 746 outputs signals that indicate the decoding result of the remainder (2 bits) of the lower-order 4-bit address signal portion.

Each of the $2^2$ AND operation circuits of the second AND operation circuit section 745 is a three-input one-output AND circuit. Each of the $2^2$ AND operation circuits of the second AND operation circuit section 745 includes a first input section that receives the output enable signal OEV, a second input section that receives a first 1-bit address signal portion (inverted or non-inverted) of part (2 bits) of the lower-order 4-bit address signal portion, and a third input section that receives a second 1-bit address signal portion (inverted or non-inverted) of part (2 bits) of the lower-order 4-bit address signal portion. Each of the $2^2$ AND operation circuits of the second AND operation circuit section 745 performs an AND operation on the signals input to the first, second, and third input sections. The second AND operation circuit section 745 outputs signals that indicate the decoding result of part (2 bits) of the lower-order 4-bit address signal portion.

Each of the $2^4$ AND operation circuits of the first AND operation circuit section 743 is a two-input, one-output AND circuit. Each of the $2^4$ AND operation circuits of the first AND operation circuit section 743 includes a first input section that receives a corresponding signal among the decoding result signals from the first logic circuit section 746, and a second input section that receives a corresponding signal among the decoding result signals from the second AND operation circuit section 745. Each of the $2^4$ AND operation circuits of the first AND operation circuit section 743 performs an AND operation on the signals input to the first and second input sections. The first AND operation circuit section 743 outputs signals AD_L0 to AD_L15 that indicate the decoding result of the lower-order 4-bit address signal portion The output enable signal OEV is input to the second AND operation circuit section 745, and the signals from the second AND operation circuit section 745 are input to the first AND operation circuit section 743. As shown in FIG. 2, the output enable signal OEV has a pulse width shorter than the logical time length of the address signal ADR. Therefore, noise or a glitch due to the signals AD_L0 to AD_L15 that indicate the decoding result of the lower-order 4-bit address signal portion can be prevented by the output enable signal OEV.

The second AND operation circuit section 745 can be formed by $2^2$ three-input, one-output AND circuits. The $2^2$ three-input, one-output AND circuits may be considered to be a combination of $2^2$ two-input, one-output AND circuits for the output enable signal OEV and $2^2$ two-input, one-output AND circuits for part (2 bits) of the lower-order 4-bit address signal portion. When applying a latch circuit such as the latch circuit LT shown in FIG. 1 or 5 of JP-A-2005-070673 to the example shown in FIG. 3, $2^4$ latch circuits are required. Since a latch circuit requires a chip size larger than that of a two-input, one-output AND circuit, this embodiment that utilizes the $2^2$ two-input, one-output AND circuits for the output enable signal OEV can reduce the chip size as compared with the case of using $2^4$ latch circuits.

As shown in FIG. 6, the second decoder section 742 has a configuration similar to that of the first decoder section 742. The second decoder section 742 includes the third AND operation circuit section 744 that outputs signals AD_H0 to AD_H15 that indicate the decoding result of the higher-order 4-bit address signal portion. The third AND operation circuit section 744 includes $2^4$ AND operation circuits (e.g., AND circuits). The second decoder section 742 further includes the fourth AND operation circuit section 747 that outputs signals that indicate the decoding result of part (2 bits) of the higher-order 4-bit address signal portion. The fourth AND operation circuit section 747 includes $2^2$ AND operation circuits (e.g., AND circuits). The second decoder section 742 further includes the second logic circuit section 748 that outputs signals that indicate the decoding result of the remainder (2 bits) of the higher-order 4-bit address signal portion. The second logic circuit section 748 includes $2^2$ AND operation circuits (e.g., AND circuits).

The output enable signal OEV is input to the fourth AND operation circuit section 747, and the signals from the fourth AND operation circuit section 747 are input to the second AND operation circuit section 744. Therefore, noise or a glitch due to the signals AD_H0 to AD_H15 that indicate the decoding result of the higher-order 4-bit address signal portion can be prevented by the output enable signal OEV FIG. 7 shows a modification of the first decoder section 741 shown in FIG. 5 (another specific configuration example of the first decoder section 741 shown in FIG. 1).

The first logic circuit section 746 shown in FIG. 5 may include a first inverter circuit section that receives signals that indicate the decoding result of the remainder (2 bits) of the lower-order 4-bit address signal portion. The first logic circuit section 746 and the first inverter circuit section form a NAND circuit section. In this case, the second AND operation circuit section 745 may also include a second inverter circuit section that receives signals that indicate the decoding result of part (2 bits) of the lower-order 4-bit address signal portion. The second AND operation circuit section 745 and the second inverter circuit section form a NAND circuit section. The first AND operation circuit section 743 may include a third inverter circuit section that receives signals from the first inverter circuit section of the first logic circuit section 746, and a fourth inverter circuit section that receives signals from the second inverter circuit section of the second AND operation circuit section 745. The first AND operation circuit section 743, the third inverter circuit section, and the fourth inverter circuit section form a NOR circuit section.

Figure 8:
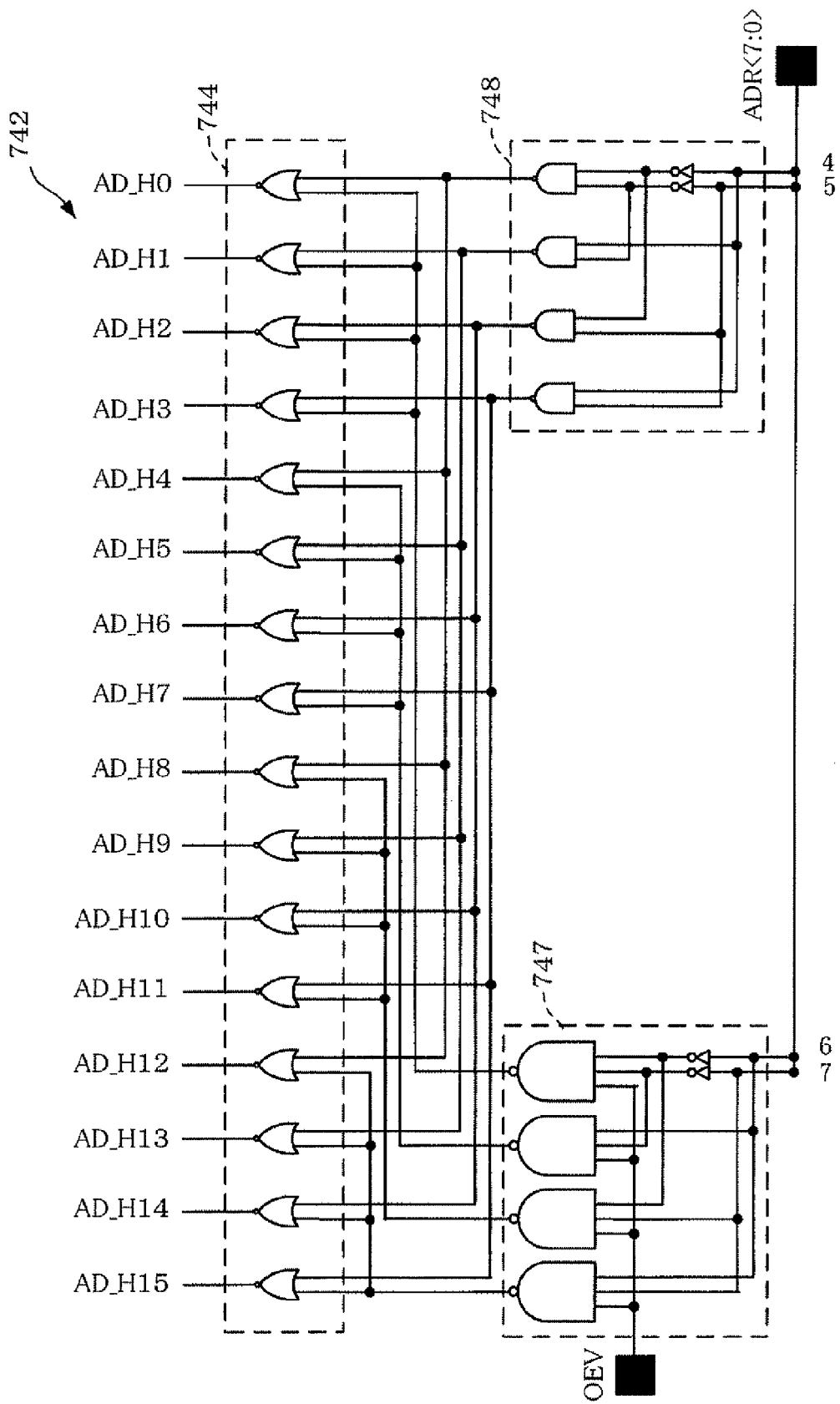
FIG. 8 shows another specific configuration example of the second decoder section 742 shown in FIG. 1.

FIG. 8 shows a modification of the second decoder section 742 shown in FIG. 6 (another specific configuration example of the second decoder section 742 shown in FIG. 1).

Figure 7:
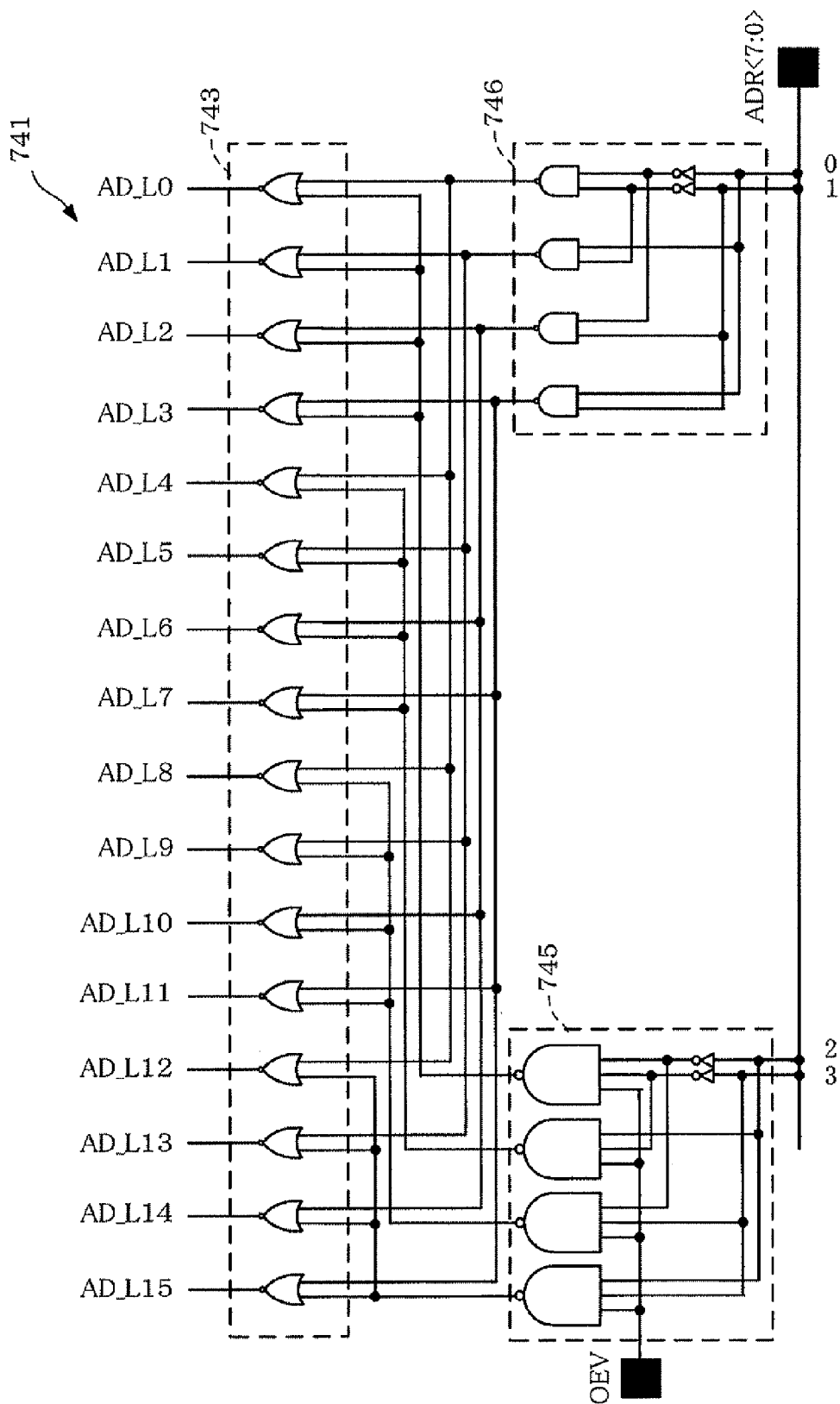
FIG. 7 shows another specific configuration example of the first decoder section 741 shown in FIG. 1.

The second decoder section 742 shown in FIG. 6 has a configuration similar to that of the first decoder section 741 shown in FIG. 7.

Figure 9:
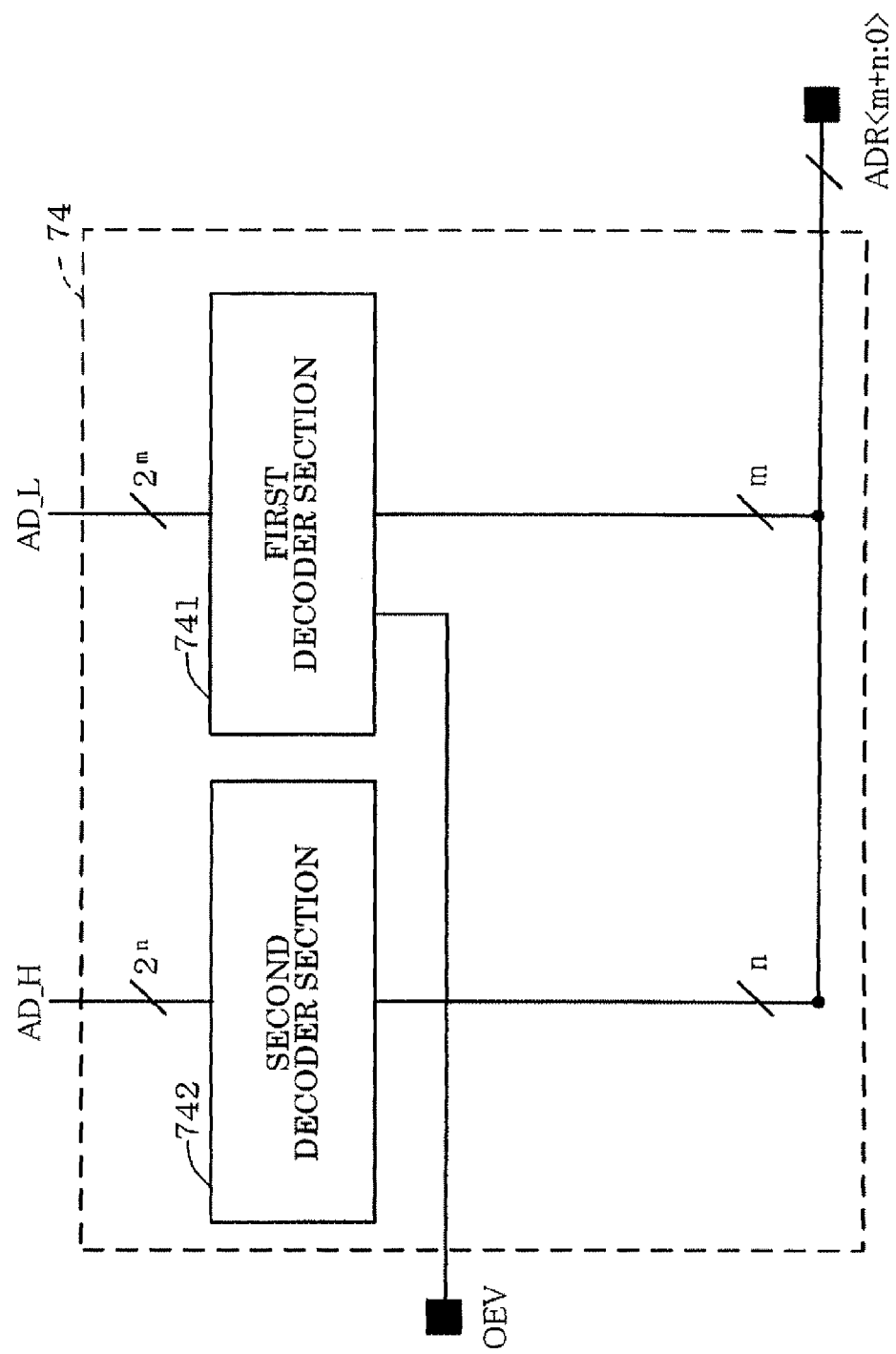
FIG. 9 shows another configuration example of the decoder circuit.

FIG. 9 shows another configuration example of the decoder circuit. In FIG. 9, the output enable signal OEV is not input to the second decoder section 742. In FIGS. 1 and 9, the first decoder section 741 and the second decoder section 742 may be replaced by each other Specifically, the first decoder section 741 may decode the higher-order 4-bit address signal portion, and the second decoder section 742 may decode the lower-order 4-bit address signal portion.

2. Output Circuit

Figure 10:
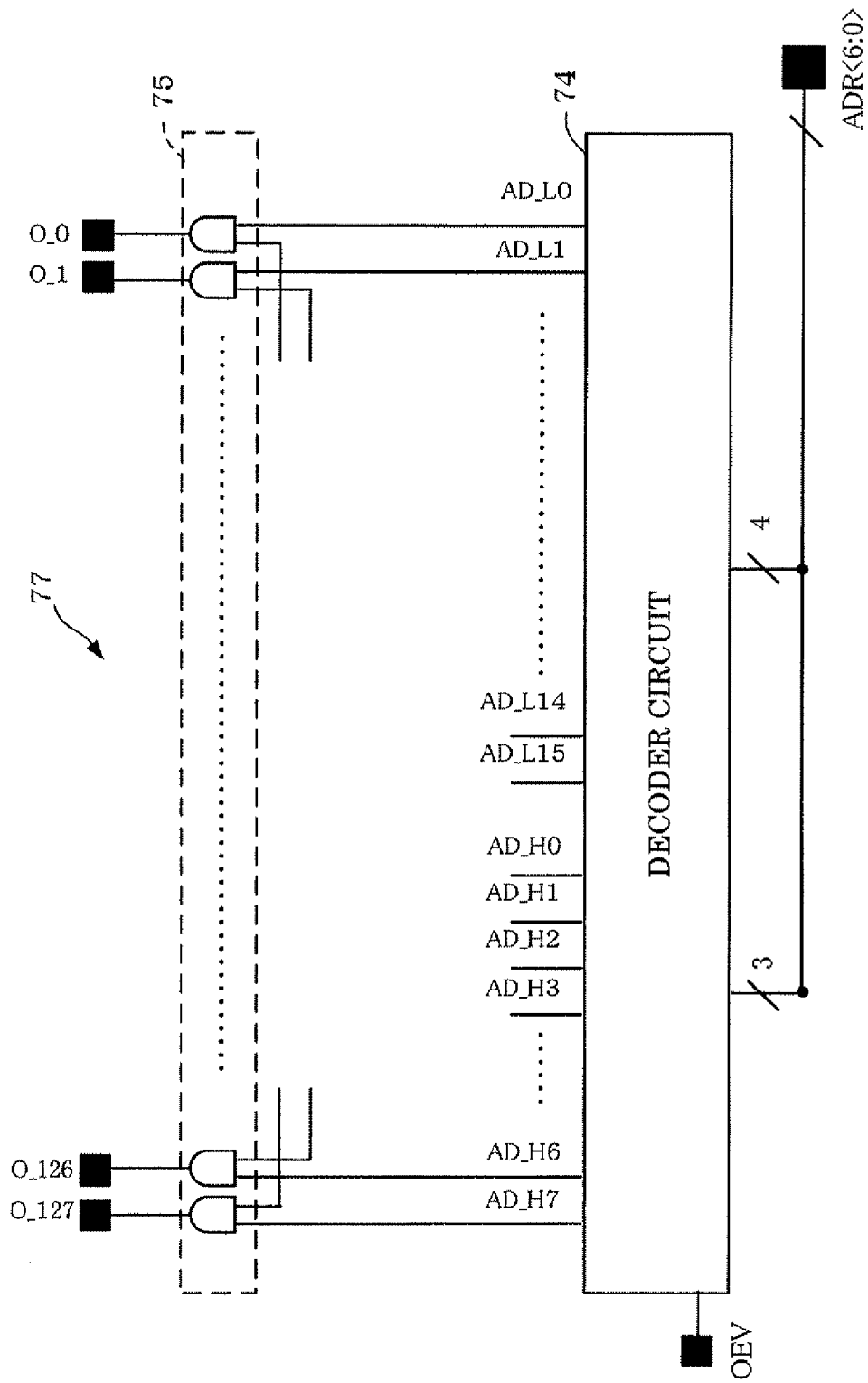
FIG. 10 shows a configuration example of an output circuit.

FIG. 10 shows a configuration example of an output circuit. As shown in FIG. 10, an output circuit 77 includes a decoder circuit 74 that decodes an (m+n)-bit address signal ADR, and M AND operation circuits 75. In the example shown in FIG. 10, a 7-bit address signal ADR includes a lower-order 4-bit address signal portion and a higher-order 3-bit address signal portion. The decoder circuit 74 is formed by the decoder circuit shown in FIG. 9, for example. In FIG. 10, signals AD_H0 to AD_H7 that indicate the decoding result of the higher-order 3-bit address signal portion may cause a glitch or noise at the output of the output circuit 77. However, since the output circuit 77 has the M AND operation circuits 75, the output enable signal OEV input to the first decoder section 741 prevents a glitch or noise that occurs at the output of the output circuit 77 (M AND operation circuits 75). When the output enable signal OEV is not input to the second decoder section 742 of the decoder circuit 74, the size of the output circuit 77 can be reduced.

In the example shown in FIG. 10, each of the M AND operation circuits is a two-input, one-output AND circuit. Each of the M AND operation circuits includes a first input section that receives a corresponding signal among the decoding result signals from the first decoder section 741, and a second input section that receives a corresponding signal among the decoding result signals from the second decoder section 742. Each of the M AND operation circuits 75 performs an AND operation on the signals input to the first and second input sections. The M AND operation circuits 75 output signals O_0 to O_127 that indicate the decoding result of the 7-bit address signal.

When using the 7-bit address signal, the maximum number M of the AND operation circuits 75 is $2^7=128$. When the AND operation circuits 75 corresponding to the maximum number M are not required, unnecessary AND operation circuits 75 may be omitted. For example, M may be 65.

Figure 11:
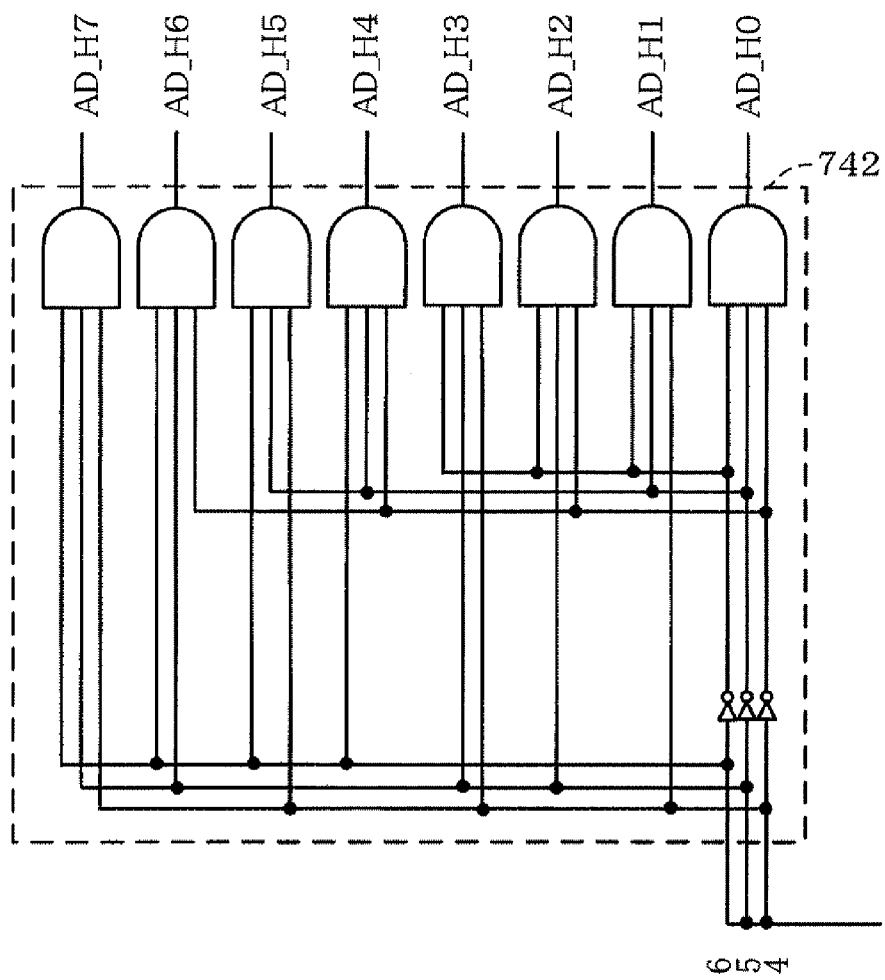
FIG. 11 shows a specific configuration example of the second decoder section 742 shown in FIG. 9.

FIG. 11 shows a specific configuration example of the second decoder section 742 in the example shown in FIGS. 9 and 10. In the example shown in FIGS. 9 and 10, the first decoder section 741 may have the configuration shown in FIG. 3, 5 or 7.

In FIG. 11, the second decoder section 742 outputs signals AD_H0 to AD_H7 that indicate the decoding result of the higher-order 3-bit address signal portion. The second decoder section includes 23 AND operation circuits (e.g., AND circuits). Each of the $2^3$ AND operation circuits of the second decoder section 742 is a three-input, one-output AND circuit. Each of the $2^3$ AND operation circuits of the second decoder section 742 includes a first input section that receives a first 1-bit address signal portion (inverted or non-inverted) of the higher-order 3-bit address signal portion, a second input section that receives a second 1-bit address signal portion (inverted or non-inverted) of the higher-order 3-bit address signal portion, and a third input section that receives a third 1-bit address signal portion (inverted or non-inverted) of the higher-order 3-bit address signal portion. Each of the $2^3$ AND operation circuits of the second decoder section 742 performs an AND operation on the signals input to the first, second, and third input sections. The second decoder section 742 outputs signals that indicate the decoding result of the higher-order 3-bit address signal portion.

Figure 12:
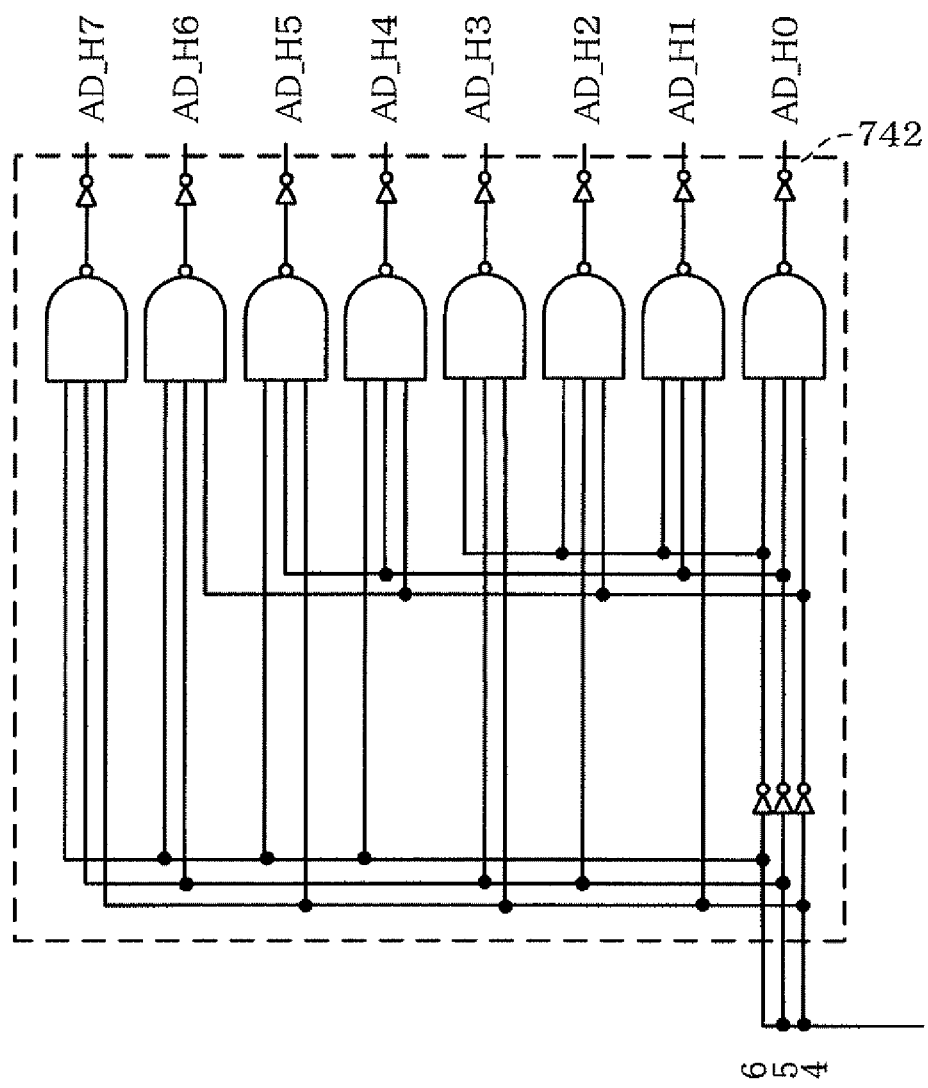
FIG. 12 shows another specific configuration example of the second decoder section 742 shown in FIG. 9.

FIG. 12 shows a modification of the second decoder section 742 shown in FIG. 11 (another specific configuration example of the second decoder section 742 shown in FIG. 9).

The second decoder section 742 shown in FIG. 11 may include a fifth inverter circuit section that receives signals that indicate the decoding result of the higher-order 3-bit address signal portion, and a sixth inverter circuit section that receives signals from the fifth inverter circuit section. The second decoder section 742 and the fifth inverter circuit section form a NAND circuit section.

Figure 13:
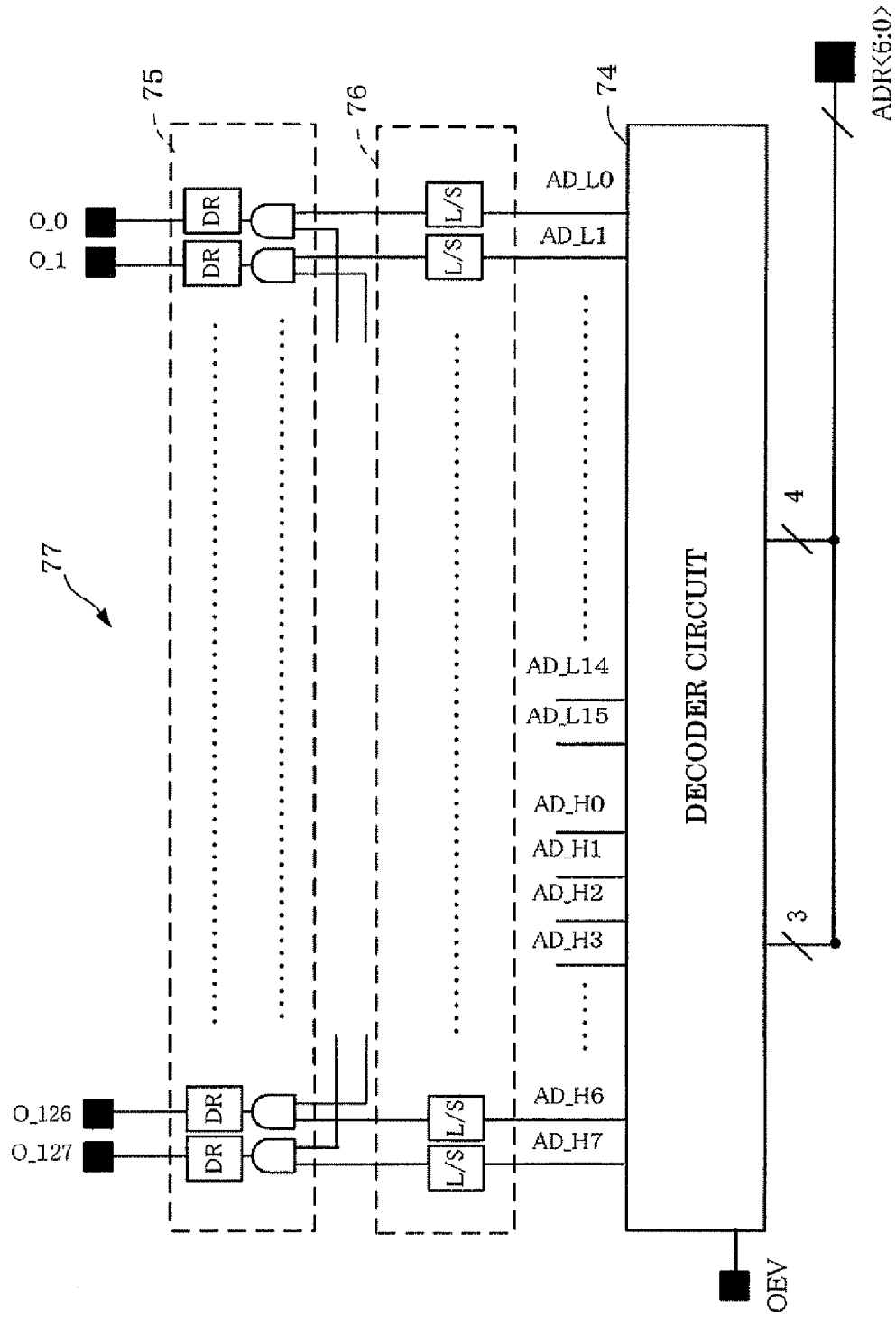
FIG. 13 shows a modification of the output circuit shown in FIG. 10.

FIG. 13 shows a modification of the output circuit shown in FIG. 10.

The output circuit 77 may include a level shifter section 76. The level shifter section 76 includes a first level shifter section L/S (L0 to L15) that shifts the levels of the signals from the first decoder section 741, and a second level shifter section L/S (H0 to H7) that shifts the levels of the signals from the second decoder section 742. Each level shifter L/S changes the voltage of the signal from the first decoder section 741 or the second decoder section 742, for example. The M AND operation circuits 75 receive the signals from the first decoder section 741 and the second decoder section 742 through the level shifter section 76.

Each of the M AND operation circuits 75 may include a corresponding driver circuit (buffer circuit). The decoder circuit 74 shown in FIG. 13 (FIG. 10) may be formed by the decoder circuit shown in FIG. 1, for example.

$2^{m-1} < M^{0.5} \leq 2^m$ is satisfied when $2^{m+n-1} < M \leq 2^{m+n}$. The (m+n)-bit address signal is divided into the m-bit address signal portion and the n-bit address signal portion. The number of level shifters in the level shifter sections 76 can be minimized under the above conditions. For example, when M is 5 to 8, m=2 and n=1. When M is 9 to 16, m=2 and n=2. When M is 17 to 32, m=3 and n=2. When M is 33 to 64, m=3 and n=3. When M is 65 to 128, m=4 and n=3. When M is 129 to 256, m=4 and n=4. When M is 257 to 512, m=4 and n=5. When M is 513 to 1024, m=5 and n=5.

3. Integrated Circuit Device

Figure 14:
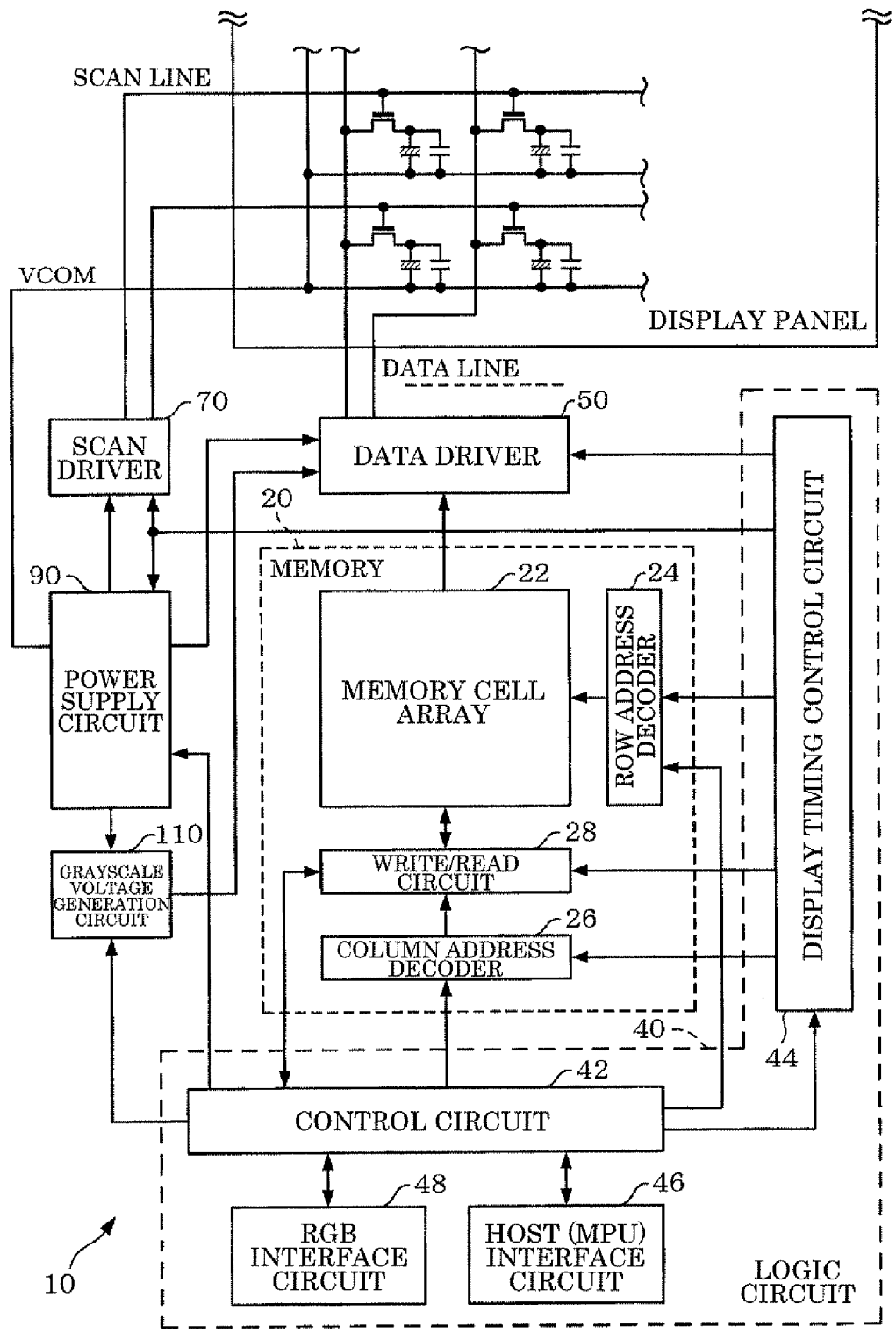
FIG. 14 shows a circuit configuration example of an integrated circuit device.

FIG. 14 shows a circuit configuration example of an integrated circuit device 10. The circuit configuration of the integrated circuit device 10 is not limited to the configuration shown in FIG. 14. Various modifications and variations may be made. A memory 20 (display data RAM) stores image data. A memory cell array 22 includes a plurality of memory cells. The memory cell array 22 stores image data (display data) corresponding to at least one frame (one screen). In this case, one pixel is made up of R, G, and B subpixels (three dots), and six-bit (n-bit) image data is stored corresponding to each subpixel, for example. A row address decoder 24 (MPU/LCD row address decoder) decodes a row address, and selects a wordline of the memory cell array 22. A column address decoder 26 (MPU column address decoder) decodes a column address, and selects a bitline of the memory cell array 22. A write/read circuit 28 (MPU write/read circuit) writes image data into the memory cell array 22, or reads image data from the memory cell array 22. The access area of the memory cell array 22 is defined by a quadrilateral having a start address and an end address as opposite vertices. Specifically, the access area is defined by the column address and the row address of the start address and the column address and the row address of the end address so that the memory is accessed.

A logic circuit 40 (e.g., automatic placement-routing circuit) generates a control signal that controls the display timing, a control signal that controls the data processing timing, and the like. The logic circuit 40 may be formed by automatic placement and routing (e.g., gate array (G/A)), for example. A control circuit 42 generates various control signals, and controls the entire device. In more detail, the control circuit 42 outputs grayscale characteristic (gamma characteristic) adjustment data (gamma correction data) to a grayscale voltage generation circuit 110, and controls voltage generation of a power supply circuit 90. The control circuit 42 also controls a memory write/read process using the row address decoder 24, the column address decoder 26, and the write/read circuit 28. A display timing control circuit 44 generates various control signals that control the display timing, and controls reading of image data from the memory into the display panel. A host (MPU) interface circuit 46 realizes a host interface for accessing the memory by generating an internal pulse each time it is accessed from a host. An RGB interface circuit 48 realizes an RGB interface for writing video image RGB data into the memory based on a dot clock signal. Note that the integrated circuit device 10 may be configured to include only one of the host interface circuit 46 and the RGB interface circuit 48.

In FIG. 14, the host interface circuit 46 and the RGB interface circuit 48 access the memory 20 in pixel units. The image data designated by a line address and read in line units is supplied to a data driver 50 in a line cycle at an internal display timing independent of the host interface circuit 46 and the RGB interface circuit 48.

Figure 15:
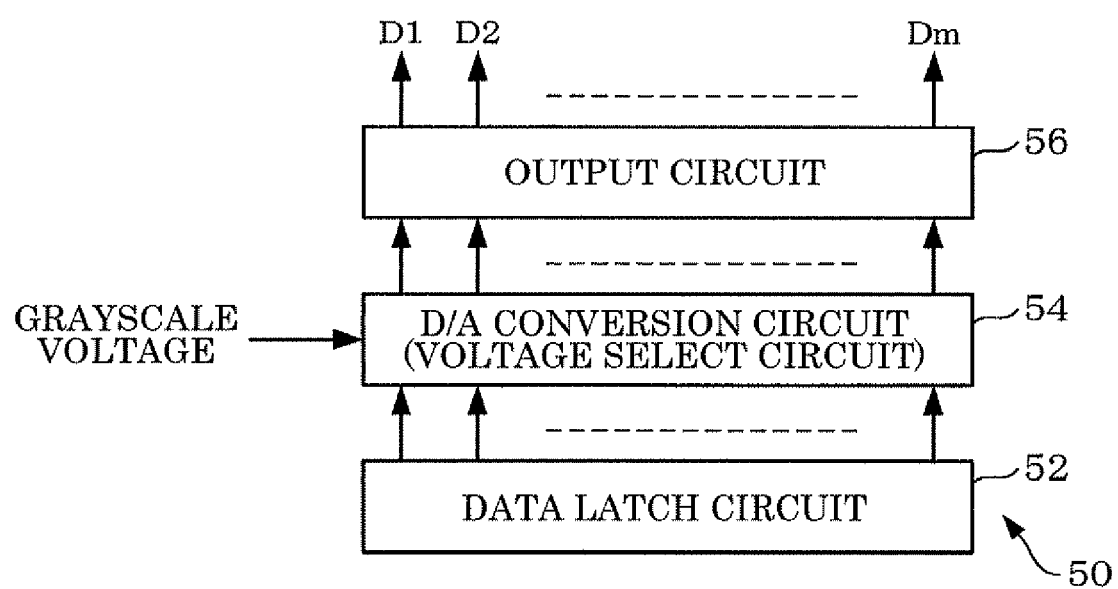
FIG. 15 shows a configuration example of a data driver.

The data driver 50 is a circuit that drives a data line of the display panel. FIG. 15A shows a configuration example of the data driver 50. A data latch circuit 52 latches digital image data from the memory 20. A D/A conversion circuit 54 (voltage select circuit) performs D/A conversion of the digital image data latched by the data latch circuit 52, and generates an analog data voltage. Specifically, the data driver 50 receives a plurality of (e.g., 64 stages) grayscale voltages (reference voltages) from the grayscale voltage generation circuit 110, selects the voltage corresponding to the digital image data from the grayscale voltages, and outputs the selected voltage as the data voltage. An output circuit 56

(driver circuit or buffer circuit) buffers the data voltage from the D/A conversion circuit 54, and outputs the data voltage to the data line of the display panel to drive the data line. Note that part (e.g., an output stage of an operational amplifier) of the output circuit 56 may not be provided in the data driver 50 but be disposed in another area.

A scan driver 70 is a circuit that drives scan lines of the display panel. The output circuit 77 shown in FIG. 13 may be used as the scan driver 70. A scan address generation circuit generates and outputs a scan address signal (ADR), and the address decoder 74 decodes the scan address. A scan voltage is output to the scan line specified by the decoding processing and the M AND operation circuits 75 through the level shifter 76 and the driver circuit DR (buffer circuit).

The power supply circuit 90 is a circuit that generates various power supply voltages. The grayscale voltage generation circuit 110 (gamma correction circuit) is a circuit that generates the grayscale voltage.

The invention may be applied to a liquid crystal device that utilizes a liquid crystal as an electro-optical material. The invention may also be applied to an electro-optical device utilizing an electro-optical effect, such as an electroluminescence (EL) device, a plasma display device, a fluorescent display tube, or an organic EL device.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention.

What is claimed is:

1. A decoder circuit that decodes an (m+n)-bit address signal that includes an m-bit address signal portion and an n-bit address signal portion, the decoder circuit comprising:
   a first decoder section that decodes the m-bit address signal portion; and
   a second decoder section that decodes the n-bit address signal portion,
   the first decoder section including a first AND operation circuit section that outputs signals that indicate a decoding result of the m-bit address signal portion, and a second AND operation circuit section that outputs signals that indicate a decoding result of part of the m-bit address signal portion,
   the second decoder section including a third AND operation circuit section that outputs signals that indicate a decoding result of the n-bit address signal portion, and a fourth AND operation circuit section that outputs signals that indicate a decoding result of part of the n-bit address signal portion,
   an output enable signal that has a pulse width shorter than a logical time length of the (m+n)-bit address signal being input to the second AND operation circuit section, and
   the output enable signal being input to the fourth AND operation circuit section.

2. The decoder circuit as defined in claim 1,
   the second AND operation circuit section including at least one first AND operation circuit, the output enable signal being input to the at least one first AND operation circuit, and
   the fourth AND operation circuit section including at least one second AND operation circuit, the output enable signal being input to the at least one second AND operation circuit.

3. The decoder circuit as defined in claim 1,
   the second AND operation circuit section including a plurality of first AND operation circuits, the output enable signal being input to each of the plurality of first AND operation circuits, and
   the fourth AND operation circuit section including a plurality of second AND operation circuits, the output enable signal being input to each of the plurality of second AND operation circuits.

4. The decoder circuit as defined in claim 1,
   the first decoder section further including a first logic circuit section that outputs signals that indicate a decoding result of the remainder of the m-bit address signal portion, the output enable signal being not input to the first logic circuit section, and
   the second decoder section further including a second logic circuit section that outputs signals that indicate a decoding result of the remainder of the n-bit address signal portion, the output enable signal being not input to the second logic circuit section.

5. An electro-optical device comprising the decoder circuit as defined in claim 1.

6. An electronic instrument comprising the decoder circuit as defined in claim 1.

7. An output circuit comprising:
   a decoder circuit that decodes an (m+n)-bit address signal; and
   M (M is an integer) AND operation circuits,
   the decoder circuit including
   a first decoder section that decodes an m-bit address signal portion of the (m+n)-bit address signal, and
   a second decoder section that decodes an n-bit address signal portion of the (m+n)-bit address signal,
   the first decoder section including a first AND operation circuit section that outputs signals that indicate a decoding result of the m-bit address signal portion, and a second AND operation circuit section that outputs signals that indicate a decoding result of part of the m-bit address signal portion, and
   the signals from the first decoder section and the signals from the second decoder section being input to each of the M AND operation circuits.

8. The output circuit as defined in claim 7, further comprising:
   a first level shifter section that shifts levels of the signals from the first decoder section; and
   a second level shifter section that shifts levels of the signals from the second decoder section,
   the signals from the first decoder section being input to each of the M AND operation circuits through the first level shifter section, the signals from the second decoder section being input to each of the M AND operation circuits through the second level shifter section.

9. The output circuit as defined in claim 7,
   $2^{m-1} < M^{0.5} \leq 2^m$ being satisfied when $2^{m+n-1} < M \leq 2^{m+n}$.

10. An electro-optical device comprising the output circuit as defined in claim 7.

11. An electronic instrument comprising the output circuit as defined in claim 7.

12. A decoding method comprising:
    preparing an (m+n)-bit address signal;
    preparing an output enable signal that has a pulse width shorter than a logical time length of the (m+n)-bit address signal;

decoding part of a lower-order n-bit address signal portion of the (m+n)-bit address signal to generate a first decoding result;

decoding the remainder of the lower-order n-bit address signal portion and the output enable signal to generate a second decoding result;

decoding the first decoding result and the second decoding result to generate a third decoding result;

decoding a higher-order m-bit address signal portion of the (m+n)-bit address signal to generate a fourth decoding result; and decoding the third decoding result and the fourth decoding result to generate a fifth decoding result.

* * * * *